(12) United States Patent
Lin et al.

(10) Patent No.: US 10,985,019 B2
(45) Date of Patent: *Apr. 20, 2021

(54) METHOD OF FORMING A SEMICONDUCTOR DEVICE USING LAYERED ETCHING AND REPAIRING OF DAMAGED PORTIONS

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Shih-Yen Lin, Tainan (TW); Kuan-Chao Chen, Tainan (TW); Si-Chen Lee, Taipei (TW); Samuel C. Pan, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,822

(22) Filed: Apr. 27, 2020

(65) Prior Publication Data

US 2020/0266059 A1    Aug. 20, 2020

Related U.S. Application Data

(60) Continuation of application No. 16/383,560, filed on Apr. 12, 2019, now Pat. No. 10,636,652, which is a
(Continued)

(51) Int. Cl.
*H01L 27/115* (2017.01)
*H01L 27/1159* (2017.01)
(Continued)

(52) U.S. Cl.
CPC ...... *H01L 21/02568* (2013.01); *B01J 27/045* (2013.01); *C01G 39/06* (2013.01);
(Continued)

(58) Field of Classification Search
CPC ............. H01L 29/778; H01L 29/78681; H01L 29/78684; H01L 29/78687;
(Continued)

(56) References Cited

U.S. PATENT DOCUMENTS 10,163,932 B1    12/2018  Sinitskii et al.
2004/0178414 A1*  9/2004  Frey .................... H01L 51/5206
                                              257/79
(Continued)

OTHER PUBLICATIONS

Kuan-Chao Chen et al., "Enhancement of field-effect mobility in molybdenum-disulfide transistor through the treatment of low-power oxygen plasma", Japanese Journal of Applied Physics, vol. 55, (2016), pp. 1-4.
(Continued)

*Primary Examiner* — Brian Turner
(74) *Attorney, Agent, or Firm* — McDermott Will & Emery LLP

(57) ABSTRACT

A method of fabricating a semiconductor device includes plasma etching a portion of a plurality of metal dichalcogenide films comprising a compound of a metal and a chalcogen disposed on a substrate by applying a plasma to the plurality of metal dichalcogenide films. After plasma etching, a chalcogen is applied to remaining portions of the plurality of metal dichalcogenide films to repair damage to the remaining portions of the plurality of metal dichalcogenide films from the plasma etching. The chalcogen is S, Se, or Te.

20 Claims, 10 Drawing Sheets

Related U.S. Application Data division of application No. 15/726,038, filed on Oct. 5, 2017, now Pat. No. 10,269,564.

(60) Provisional application No. 62/472,658, filed on Mar. 17, 2017.

(51) Int. Cl.

| | | |
|---|---|---|
| *H01L 29/792* | (2006.01) | |
| *H01L 29/78* | (2006.01) | |
| *H01L 29/04* | (2006.01) | |
| *H01L 21/02* | (2006.01) | |
| *B01J 27/045* | (2006.01) | |
| *H01L 29/778* | (2006.01) | |
| *C01G 39/06* | (2006.01) | |
| *H01L 29/267* | (2006.01) | |
| *H01L 29/417* | (2006.01) | |
| *H01L 29/66* | (2006.01) | |
| *H01L 29/786* | (2006.01) | |
| *H01L 29/10* | (2006.01) | |
| *H01L 29/24* | (2006.01) | |
| *H01L 21/3065* | (2006.01) | |
| *C01B 32/186* | (2017.01) | |

(52) U.S. Cl.
CPC ...... *H01L 21/0242* (2013.01); *H01L 21/0262* (2013.01); *H01L 21/02205* (2013.01); *H01L 21/02499* (2013.01); *H01L 21/02614* (2013.01); *H01L 21/02664* (2013.01); *H01L 21/3065* (2013.01); *H01L 29/1054* (2013.01); *H01L 29/24* (2013.01); *H01L 29/267* (2013.01); *H01L 29/41766* (2013.01); *H01L 29/66969* (2013.01); *H01L 29/778* (2013.01); *H01L 29/786* (2013.01); *H01L 29/78681* (2013.01); *H01L 29/78696* (2013.01); *C01B 32/186* (2017.08)

(58) Field of Classification Search
CPC ........... H01L 29/78696; H01L 21/0262; H01L 29/1606; H01L 29/78648; H01L 29/66969; H01L 29/78618; H01L 29/24; H01L 29/267; H01L 29/41766; H01L 21/02568

See application file for complete search history.

(56) References Cited

U.S. PATENT DOCUMENTS

| | | |
|---|---|---|
| 2014/0131698 A1 | 5/2014 | Kim et al. |
| 2015/0114446 A1* | 4/2015 | Probst ............ H01L 31/022425 |
| | | 136/244 |
| 2016/0056301 A1 | 2/2016 | Lee |
| 2016/0189967 A1 | 6/2016 | Nakazawa et al. |
| 2016/0190244 A1 | 6/2016 | Lee et al. |
| 2017/0012117 A1 | 1/2017 | Radosavljevic et al. |
| 2017/0229576 A1 | 8/2017 | Cho et al. |
| 2017/0345944 A1 | 11/2017 | Lin et al. |
| 2018/0158955 A1 | 6/2018 | Jonker et al. |
| 2018/0226248 A1* | 8/2018 | Jahangir ............... H01L 29/778 |
| 2018/0308965 A1* | 10/2018 | Then ...................... H01L 29/24 |

OTHER PUBLICATIONS

Chong_Rong Wu et al., "Establishment of 2D Crystal Heterostructures by Sulfurization of Sequential Transition Metal Depositions: Preparation, Characterization, and Selective Growth", American Chemical Society, Nano Letters, vol. 16, (2016), pp. 7093-7097.

Chong_Rong Wu et al., "Multilayer MoS2 prepared by one-time and repeated chemical vapor depositions; anomalous Raman shifts and transistors with high On/Off ratio", Journal of Physics D: Applied Physics, vol. 48, (2015), pp. 1-7.

Chong-Rong Wu et al., "The Growth Mechanism of Transition Metal Dichalcogenides by using Sulfurization of Pre-deposited Transition Metals and the 2D Crystal Hetero-structure Establishment", Scientific Reports, vol. 7, No. 42146 (2017), pp. 1-8.

Office Action issued in related U.S. Appl. No. 15/726,038, dated Apr. 24, 2018.

Office Action issued in related U.S. Appl. No. 15/726,038, dated Oct. 15, 2018.

Notice of Allowance issued in related U.S. Appl. No. 15/726,038, dated Feb. 13, 2019.

Non-Final Office Action issued in related U.S. Appl. No. 16/383,560, dated Aug. 22, 2019.

Notice of Allowance issued in related U.S. Appl. No. 16/383,560, dated Dec. 18, 2019.

* cited by examiner

METHOD OF FORMING A SEMICONDUCTOR DEVICE USING LAYERED ETCHING AND REPAIRING OF DAMAGED PORTIONS

CROSS-REFERENCE TO RELATED APPLICATIONS

This application is a continuation of U.S. application Ser. No. 16/383,560, filed on Apr. 12, 2019, now U.S. Pat. No. 10,636,652, which is a divisional of U.S. application Ser. No. 15/726,038 filed Oct. 5, 2017, now U.S. Pat. No. 10,269,564, which claims the priority of U.S. Provisional Application No. 62/472,658 filed Mar. 17, 2017, the entire contents of each of which are incorporated herein by reference.

TECHNICAL FIELD

The disclosure relates to two-dimensional (2D) materials for semiconductor devices, and more particularly to 2D crystal hetero-structures and manufacturing methods thereof.

BACKGROUND

A two-dimensional semiconductor (also known as a 2D semiconductor) is a type of natural semiconductor with thicknesses on the atomic scale. A 2D monolayer semiconductor is significant because it exhibits stronger piezoelectric coupling than traditionally employed bulk forms, which enables 2D materials applications in new electronic components used for sensing and actuating. Transition metal dichalcogenides have been used in 2D devices. Performance of single 2D transition metal dichalcogenide materials for device applications is reaching an upper limit. Because 2D materials are very thin, as thin as a single monolayer, etching 2D materials is difficult to do without damaging the remaining unetched portions of the 2D materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
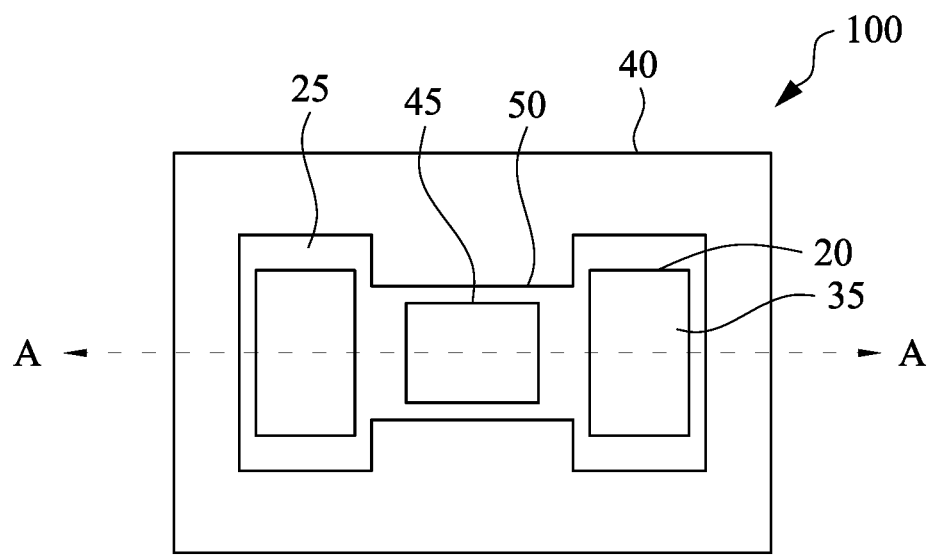
FIGS. 1A and 1B are a plan view and a cross-sectional view of a semiconductor device according to an embodiment of the disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In some embodiments of the disclosure, the 2D material is a metal dichalcogenide except a metal oxide having a layer thickness of about 0.5 nm to about 10 nm. In some embodiments, the metal dichalcogenide is a transition metal dichalcogenide. In some embodiments, the transition metal dichalcogenide is selected from the group consisting of $MoS_2$, $WS_2$, $MoSe_2$, $WSe_2$, $MoTe_2$, and $WTe_2$.

Recent investigations in enhanced 2D device performance have been in the field of 2D crystal hetero-structures. 2D crystal hetero-structures may provide improved device performance over single material 2D structures. 2D crystal hetero-structures can be established vertically by using either chemical vapor deposition (CVD) growth or sulfurization of pre-deposited transition metals. For example, compared with a MoS$_2$ transistor, significant drain current increase is observed for a WS$_2$/MoS$_2$ hetero-structure device. Field-effect mobility values of two devices with MoS$_2$ and WS$_2$/MoS$_2$ hetero-structures as the channels are 0.27 and 0.69 cm$^2$/V·s, respectively. This result indicates a type-II band alignment, electron injection from WS$_2$ to MoS$_2$, and the formation of higher electron concentration channels under thermal equilibrium could be responsible for this phenomenon. Type-I structures are single material monolayers that produce intense photoluminescence, while type-II structures produce significantly less photoluminescence due to much the lower optical recombination probability of the type-II hetero-structures.

Figure 1B:
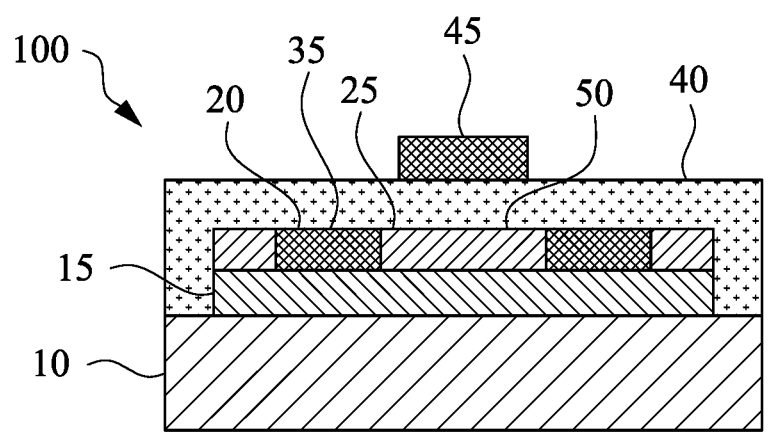

A top-gated 2D crystal hetero-structure semiconductor device 100 according to an embodiment of the disclosure is illustrated in FIGS. 1A and 1B. FIG. 1A is a plan view and FIG. 1B is a cross-sectional view according to line A-A of FIG. 1A of the semiconductor device 100. The semiconductor device 100 includes a first metal dichalcogenide film 15 formed on a substrate 10. A second metal dichalcogenide film 25 is formed on the first metal dichalcogenide film 15. Source/drain electrodes 35 are formed in the second metal dichalcogenide film 25. Source/drain electrodes used in the present disclosure to designate either a source or a drain electrode. A dielectric layer 40 overlies the second metal dichalcogenide film 25, source/drain electrodes 35, and the substrate 10. A gate electrode 45 is formed on top of the dielectric layer 40.

In some embodiments, the substrate 10 includes an insulator, such as silicon oxide or aluminum oxide substrates. In some embodiments, suitable silicon oxide substrates include silicon dioxide on silicon. In certain embodiments, the silicon substrate is a conductive substrate, such as a p-doped silicon. In other embodiments, suitable aluminum oxide substrates include sapphire.

In some embodiments, the first and second metal dichalcogenide films 15, 25 have a thickness ranging from about 0.5 nm to about 10 nm. In some embodiments, the first and second metal dichalcogenide films are transition metal dichalcogenide films that are different from each other in composition and are selected from the group consisting of MoS$_2$, WS$_2$, MoSe$_2$, WSe$_2$, MoTe$_2$, and WTe$_2$. The metal dichalcogenide films are formed by chemical vapor deposition (CVD) in some embodiments. In other embodiments, a metal film is formed on a substrate and then the metal film is reacted with a chalcogen except oxygen to form the metal dichalcogenide films.

The source/drain electrodes 35 and gate electrode 45 may be formed of any suitable conductive material including polysilicon, graphene, and metal. The source/drain electrodes 35 may be formed by chemical vapor deposition (CVD), atomic layer deposition (ALD), physical vapor deposition (PVD) (sputtering), electroplating, or other suitable method.

In some embodiments, the dielectric layer 40 is a silicon oxide, such as silicon dioxide. In other embodiments, the dielectric layer 40 is one or more layers of a silicon nitride or a high-k dielectric layer. The dielectric layer 40 may be formed by chemical vapor deposition (CVD), atomic layer deposition (ALD), or any suitable method. The thickness of the dielectric layer 40 is in a range from about 1 nm to about 10 nm in some embodiments.

In some embodiments, the source/drain electrodes 35 are formed in recesses 20, such as contact window openings, in the second metal chalcogenide film 25. The recesses 20 are formed in the second metal chalcogenide film 25 using lithography and etching operations. Because the 2D metal chalcogenide films are so thin (e.g.—a monolayer) a layer-by-layer etching operation is used to etch the 2D films.

The formation of metal dichalcogenide films and the repair of etching damaged metal dichalcogenide will be explained as set forth herein. To form a metal dichalcogenide film, in some embodiments of the present disclosure, metal films with different thicknesses, are deposited on a substrate, by using an RF sputtering system. The metal films are subsequently converted to metal dichalcogenide films. For example, in some embodiments, a metal, such as molybdenum, is deposited, on a substrate, such as sapphire, by sputtering at a power ranging from about 10 to about 100 W at a background pressure of from about $5\times10^{-2}$ Torr to about $5\times10$ Torr with an Ar gas flow of from about 10 sccm to about 100 sccm. After metal deposition, the samples are placed in the center of a hot furnace for chalcogenization, such as sulfurization. During the sulfurization procedure, Ar gas at a flow rate of from about 40 sccm to about 200 sccm is used as a carrier gas, and the furnace pressure ranges from about 0.1 Torr to about 10 Torr. The sulfurization temperature for the samples is from about 400° C. to about 1200° C. About 0.5 g to about 2 g of S powder, is heated in the gas flow stream to its evaporation temperature at about 120° C. to about 200° C. upstream of the furnace. In some embodiments, the re-sulfurization operation is performed in the same manner as sulfurization (e.g.—same temperature, pressure, gas flow, etc.).

In a certain embodiment, the molybdenum is deposited on the sapphire substrate by sputtering at a power of about 40 W at a background pressure of about $5\times10^{-3}$ Torr with about a 40 sccm Ar gas flow. The sulfurization operation takes place at an Ar flow rate of about 130 sccm, and a furnace pressure of about 0.7 Torr in a furnace at about 800° C. The S powder (about 1.5 g) is placed in the gas flow upstream of the furnace and is heated to its evaporation temperature of about 120° C. Two samples with different Mo film thicknesses of 0.5 nm and 1.0 nm were prepared using the same sulfurization procedures. Large-area MoS$_2$ films can be obtained on the sapphire substrate by using this growth technique.

In some embodiments, instead of the sulfurization operation to form S-based materials (MoS$_2$, WS$_2$, etc.) or re-sulfurization to reverse etching damage; selenization or re-selenization is performed to respectively form or repair Se-based materials, such as MoSe$_2$ and WSe$_2$; or tellurization or re-tellurization is performed to respectively form or repair Te-based materials, such as MoTe$_2$ and WTe$_2$. The parameters of the chalcogenization or re-chalcogenization operation (e.g.—temperature, pressure), are adjusted as necessary for selenium or tellurium-based materials.

In some embodiments, layer-by-layer etching of 2D material is performed to avoid damaging the unetched portions of the 2D material. The layer-by-layer etching is performed by applying a low-power oxygen plasma to the 2D material followed by a re-chalcogenization operation. However, some damage to the unetched portions may still occur.

Figure 2:
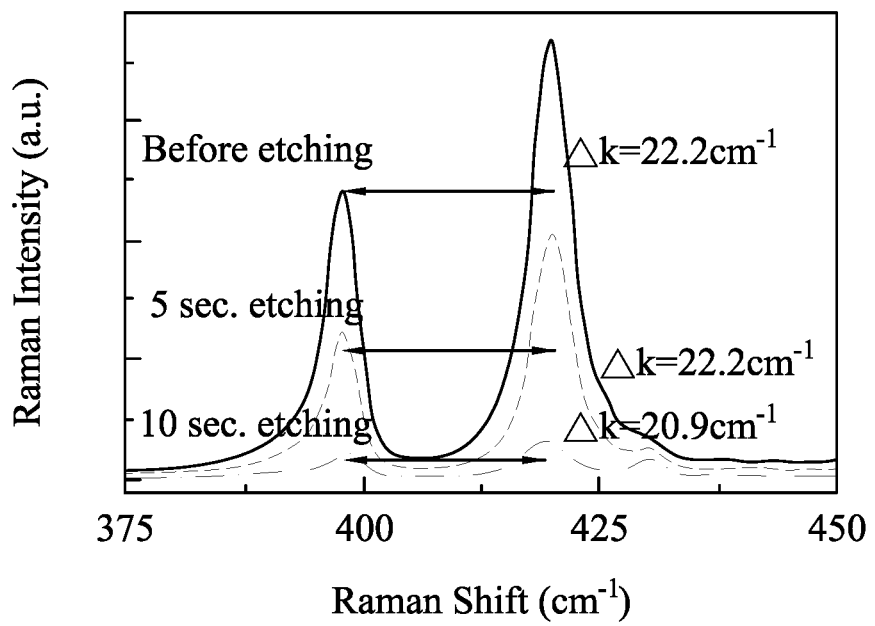
FIG. 2 shows Raman spectra of $MoS_2$ films exposed to an etchant for different periods of time.

To demonstrate the feasibility of layer-by-layer etching of a metal chalcogenide film, a 2-layer MoS$_2$ sample is grown by sulfurizing a deposited Mo film on a sapphire substrate in a certain embodiment. Cross-sectional high resolution transmission electron microscopy (HRTEM) of the sample shows that a bi-layer of MoS$_2$ is formed. A 20 W low-power oxygen plasma treatment for 5 and 10 sec. is performed on the bi-layer MoS$_2$ sample and Raman spectrographs were recorded after each plasma treatment. As shown in the Raman spectrographs of FIG. 2, after a 20 W low-power oxygen plasma treatment for 5 sec., no Δk difference is observed for the sample after 5 sec. oxygen plasma treatment, which suggests that no $MoS_2$ is etched off of the bi-layer $MoS_2$ film. On the other hand, for the sample with 10 sec. oxygen plasma treatment, the Δk value decreases from 22.2 $cm^{-1}$ to 20.9 $cm^{-1}$. The results suggest that the layer number for the sample with 10 sec. oxygen plasma treatment decreases, i.e., one layer is removed (etched). However, the Raman intensities of the two samples after oxygen plasma treatment decrease, as shown in FIG. 2, indicating that part of the $MoS_2$ is transformed into Mo oxides. For the sample with the 10 sec. oxygen plasma treatment, although a layer of $MoS_2$ is apparently etched off, part of the remaining $MoS_2$ may be transformed into Mo oxides.

To transform the Mo oxides back to $MoS_2$, re-sulfurization of the Mo oxides is performed in some embodiments of the disclosure. If the damage done by the oxygen plasma is oxidization of the $MoS_2$, the damage can be reversed or repaired by a re-sulfurization operation according to embodiments of the present disclosure.

Figure 3:
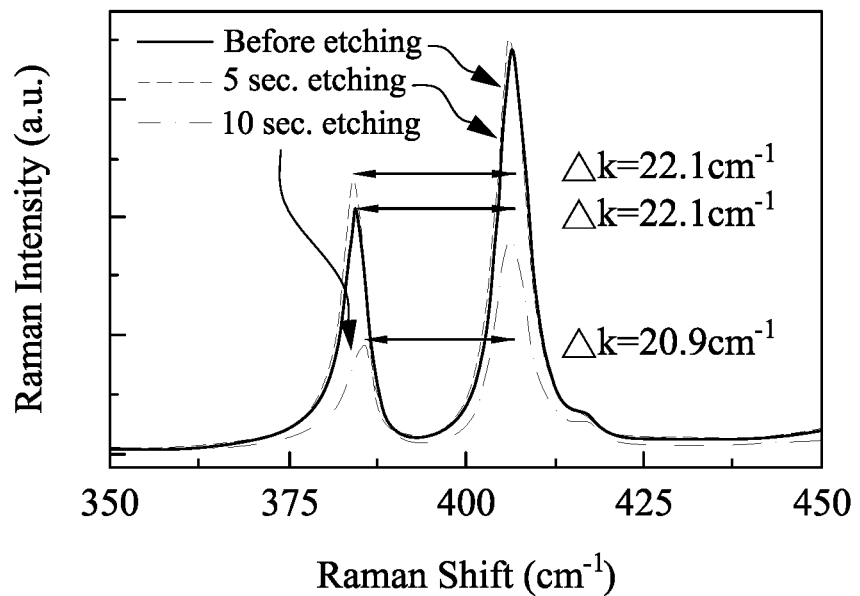
FIG. 3 shows Raman spectra of $MoS_2$ films subjected to re-sulfurization for different periods of time after being exposed to an etchant.

The Raman spectra of the samples with 5 and 10 sec. oxygen plasma treatment followed by a sulfurization procedure are shown in FIG. 3. As shown in FIG. 3, after the re-sulfurization procedure, similar Raman spectra with the un-treated sample is observed for the sample with a 5 sec. plasma treatment. The results indicate that after re-sulfurization, part of the Mo oxides is transformed back to $MoS_2$. Therefore, after the re-sulfurization procedure, the same Raman spectrum will be observed for the 5 sec. plasma sample as the unetched sample. However, for the 10 sec. plasma treatment sample, the lower Δk value of the Raman spectrum indicates that a reduced layer number is still observed for the sample. A cross-sectional HRTEM image of the sample reveals that only 1-layer $MoS_2$ is left on the sapphire substrate of the 10 sec. plasma treatment sample.

Figure 4:
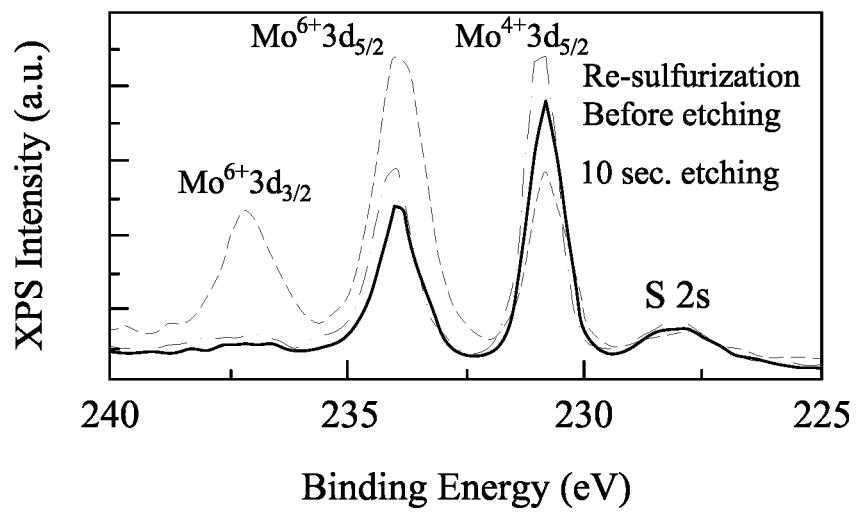
FIG. 4 shows X-ray photoelectron spectroscopy (XPS) curves of $MoS_2$ films exposed to an etchant for different periods of time.

The reversal of oxygen plasma etch damage is demonstrated by X-ray photoelectron spectroscopy (XPS) performed on the untreated sample (no oxygen plasma treatment), the sample after 10 sec. oxygen plasma treatment, and the same sample after the re-sulfurization procedure. The XPS curves are shown in FIG. 4. As shown in FIG. 4, the $Mo^{6+}3d_{3/2}$ peak is observed only for the sample after 10 sec. oxygen plasma treatment. Because the peak represents the appearance of Mo oxides, the similar XPS curves of the samples after re-sulfurization, and the sample that did not undergo the oxygen plasma treatment indicate that the oxygen plasma treatment transforms part of the remaining $MoS_2$ into Mo oxides. Based on these results, and not wanting to be limited by any theory, it appears that the etching procedure is a self-limiting process. The etching speed for the first $MoS_2$ layer is faster than the second $MoS_2$ layer. After etching off the first layer, the second or the third layers of $MoS_2$ tend to be oxidized instead of being etched off. However, after the re-sulfurization procedure the $Mo^{6+}3d_{3/2}$ peak disappears, which indicates the Mo oxides transform back to $MoS_2$. Thus, as a result of the re-sulfurization operation there is substantially no Mo oxide on the $MoS_2$ sample. In other words, Mo oxide is not detected, such as by XPS. Thus, monolayer etching of the $MoS_2$ film and a repairing operation (re-sulfurization) can be applied to the remaining $MoS_2$ to recover its material characteristics.

Figure 5:
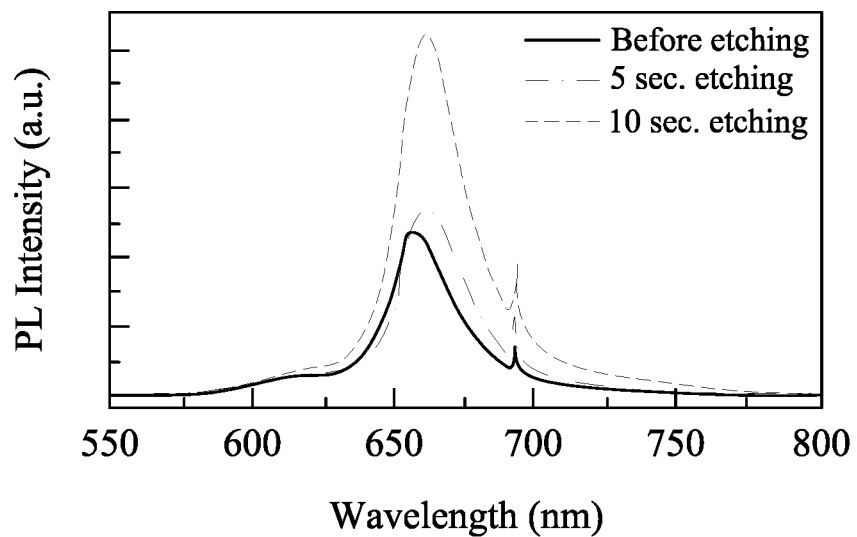
FIG. 5 shows photoluminescence spectra of $MoS_2$ films subjected to re-sulfurization for different periods of time after being exposed to an etchant.

Photoluminescence (PL) spectra provide further support of the layer-by-layer etching of $MoS_2$ according to the present disclosure. The PL spectra of the samples with 5 and 10 sec. oxygen plasma treatment followed by a re-sulfurization procedure are shown in FIG. 5. Compared with the un-treated sample (no oxygen plasma treatment), no significant PL intensity change is observed for the sample with the 5 sec. plasma treatment. However, an large PL intensity change is observed for the sample with the 10 sec. plasma treatment. Reducing the $MoS_2$ layer numbers will change the material from type-II to type-I material, and the PL intensities will significantly increasing with decreasing layer numbers. The PL spectra results are consistent with the previous observations that after the 10 sec. oxygen plasma treatment, the layer number of the $MoS_2$ film changes from 2 to 1.

Figure 6:
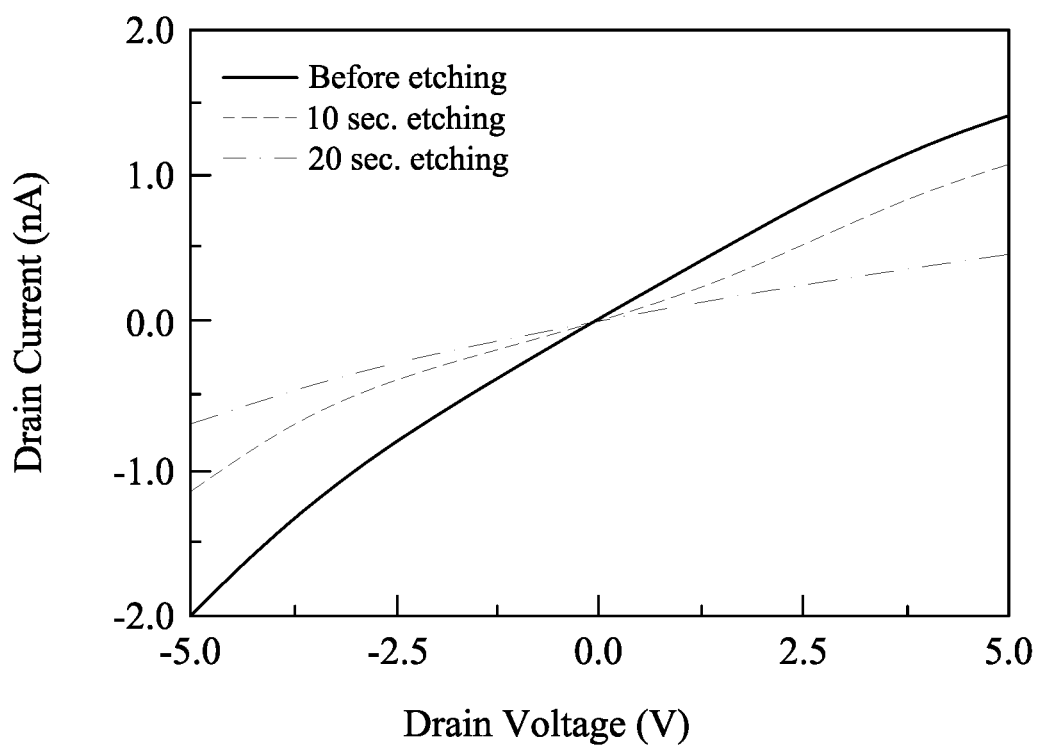
FIG. 6 shows the drain voltage versus the drain current for devices according to embodiments of the disclosure.

Another issue regarding the layer-by-layer (layered) etching of $MoS_2$ and the following re-sulfurization is whether similar carrier transport characteristics can be obtained after each etching process. A 3-layer $MoS_2$ sample was prepared by using the same growth method of sulfurization of deposited Mo films disclosed herein. After depositing Au/Ti electrodes onto the films with no plasma treatment, one oxygen plasma etching/re-sulfurization procedure, and two oxygen plasma etching/re-sulfurization procedures were performed, and the current-voltage characteristics were measured, as shown in FIG. 6. As shown in FIG. 6, the electrical currents of the three samples at 5.0 V are $1.3 \times 10^{-9}$, $9.5 \times 10^{-10}$, and $4.3 \times 10^{-10}$ A, respectively. The electrical current values are proportional to the expected $MoS_2$ layer numbers 3 (untreated), 2 (etching and re-sulfurization once), and 1 (etching and re-sulfurization twice). The results indicate that the etching and repairing (re-sulfurization) procedure is suitable for layered and selective etching applications for metal dichalcogenides.

A method for forming a semiconductor device according to an embodiment of the disclosure is disclosed in FIGS. 7A-11B. The fabrication flow of FIGS. 7A-11B describe the operations for forming the top-gated hetero-structure transistor 100 shown in FIGS. 1A and 1B by using the oxygen plasma etching/re-sulfurization operations according to some embodiments of the present disclosure.

Figure 7A:
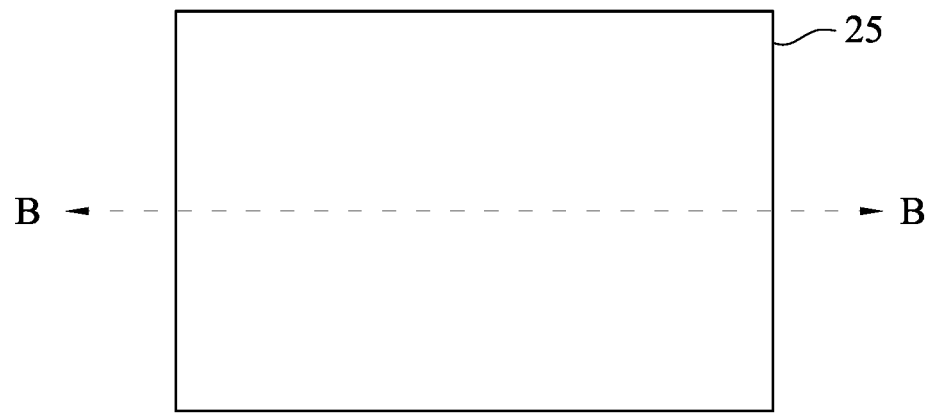
FIGS. 7A and 7B are a plan view and a cross-sectional view of a sequential stage of a method for forming a semiconductor device according to an embodiment of the disclosure.
Figure 7B:
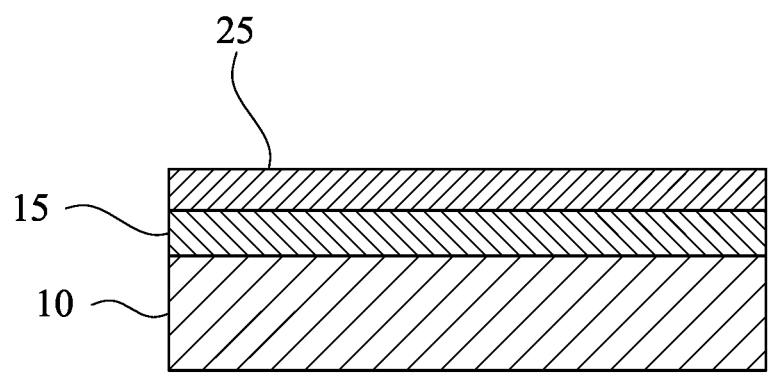

As shown in FIGS. 7A and 7B, a metal dichalcogenide hetero-structure includes a first metal dichalcogenide film 15 formed on a substrate 10 and a second metal dichalcogenide film 25 formed on the first metal dichalcogenide film 15. FIG. 7A is a plan view and FIG. 7B is a cross-sectional view along line B-B of FIG. 7A. The first metal dichalcogenide film 15 and second metal dichalcogenide film 25 are formed by chemical vapor deposition (CVD) in some embodiments. In other embodiments, a first metal film is formed by physical vapor deposition (sputtering) or atomic layer deposition (ALD) and then the first metal film is converted to a metal chalcogenide by reacting the metal film with a chalcogen. The second metal chalcogenide film 25 is subsequently formed over the first metal dichalcogenide film 15 by forming a second metal film by physical vapor deposition (sputtering) or atomic layer deposition (ALD) and then the second metal film is converted to a metal dichalcogenide by reacting the second metal film with a chalcogen in some embodiments. The first metal dichalcogenide film 15 and the second metal dichalcogenide film 25 each have a thickness of about 0.5 nm to about 10 nm in some embodiments. In certain embodiments, one or both of the first and second metal dichalcogenide films 15, 25 are monolayer films. In some embodiments, the first and second metal dichalcogenides are different transition metal dichalcogenides. In some embodiments, the transition metal dichalcogenides are selected from the group consisting of $MoS_2$, $WS_2$, $MoSe_2$, $WSe_2$, $MoTe_2$, and $WTe_2$. In certain embodiments, a $WS_2$/

MoS$_2$ hetero-structure including a MoS$_2$ film formed on a sapphire substrate, and a WS$_2$ film formed on the MoS$_2$ film is provided.

In some embodiments, metal dichalcogenide films except metal oxide films are directly formed on the device substrate, and in other embodiments, the metal dichalcogenide films are formed on another substrate and then transferred to the device substrate. For example, a first metal dichalcogenide film except a metal oxide film having a thickness of about 0.5 nm to about 10 nm is formed on a first substrate. The first metal dichalcogenide film is formed by chemical vapor deposition (CVD) in some embodiments. In other embodiments, a first metal film is formed by sputtering or atomic layer deposition and then the metal film is converted to a metal dichalcogenide by reacting the metal film with a chalcogen except oxygen. A polymer film having a thickness ranging from about 100 nm to about 5 μm is subsequently formed on first metal dichalcogenide film. In some embodiments, the polymer film is poly(methyl methacrylate) (PMMA). After forming the polymer film, the sample is heated, such as by placing the sample on a hot plate. The sample may be heated from about 30 seconds to about 20 minutes at a temperature of from about 70° C. to about 200° C. Subsequent to heating, a corner of the first metal dichalcogenide film is peeled off the substrate, such as by using a tweezers, and the sample is submerged in a solution to facilitate the separation of the first metal dichalcogenide film from the first substrate. In some embodiments, the solution is an aqueous base solution. The first metal dichalcogenide film and polymer film are transferred to a second substrate. After applying the first metal dichalcogenide film to the second substrate, the sample may stand for 30 minutes to 24 hours in some embodiments. In some embodiments, the second substrate includes silicon oxide or aluminum oxide substrates. In some embodiments, suitable silicon oxide substrates include a silicon dioxide layer formed on a silicon layer. In other embodiments, suitable aluminum oxide substrates include sapphire. The polymer film is removed from the first metal dichalcogenide film using a suitable solvent. In some embodiments, the second substrate/first metal dichalcogenide film/polymer film structure is submerged in a suitable solvent until the polymer film is dissolved. Any solvent suitable for dissolving the polymer film can be used. For example, in some embodiments, when the polymer film is a PMMA film, acetone is used as the solvent. The first metal dichalcogenide film and second substrate are subsequently annealed in some embodiments by heating in an oven at a temperature of about 200° C. to about 500° C. for about 30 minutes to about 5 hours, to provide the transferred metal dichalcogenide film on a second substrate.

In one embodiment, the film transferring operations of 2D metal sulfide crystal films is performed as follows: (1) 1.5 μm-thick poly(methyl methacrylate) (PMMA) layer is spin-coated on the 2D metal sulfide crystal film; (2) the sample is heated on a hot plate at 120° C. for 5 min; (3) a small portion at a corner of the PMMA/2D crystal film is peeled off from the sapphire substrate with tweezers; (4) the sample is submerged in a KOH solution, and the PMMA/2D crystal film is completely peeled off; (5) the PMMA/2D crystal film is placed on a 300 nm SiO$_2$/Si substrate; (6) the sample is left to stand under atmospheric condition for 8 hours; (7) the sample is then submerged in acetone to remove the PMMA; and (8) the sample is annealed in a furnace at 350° C. for 2 hours to leave the 2D metal sulfide crystal film remaining on the surface of the SiO$_2$/Si substrate.

Figure 8A:
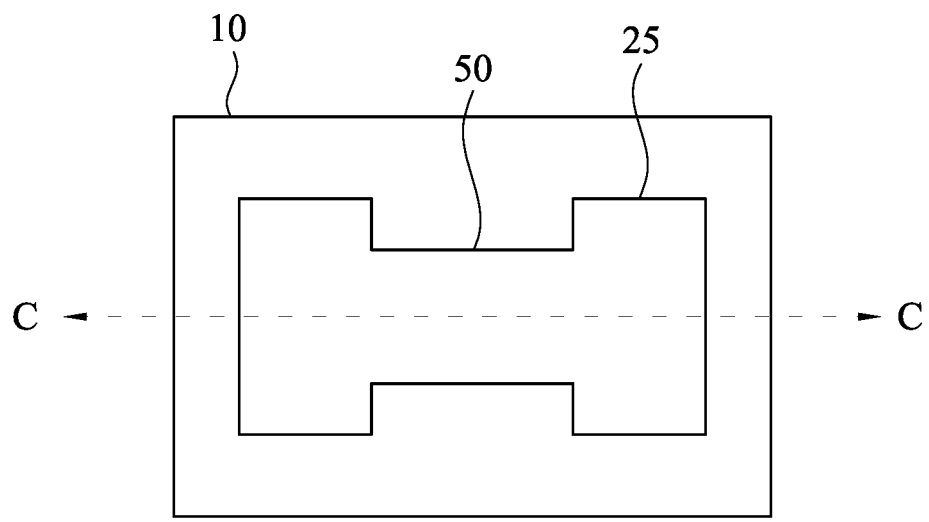
FIGS. 8A and 8B are a plan view and a cross-sectional view of a sequential stage of a method for forming a semiconductor device according to an embodiment of the disclosure.
Figure 8B:
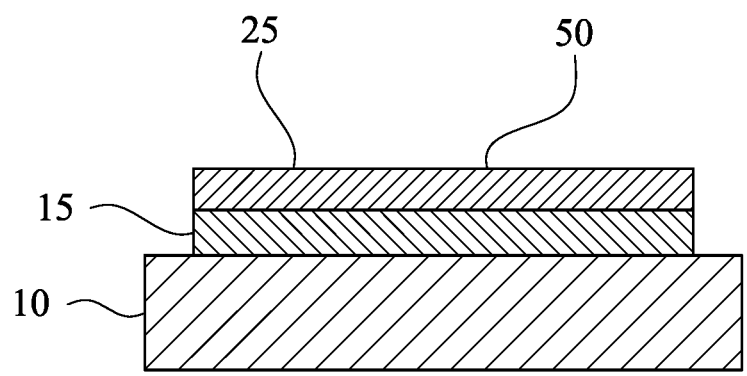

Using photolithographic and etching operations the first and second metal dichalcogenide films 15, 25 are patterned to form a channel region 50, as shown in FIGS. 8A and 8B. FIG. 8A is a plan view and FIG. 8B is a cross-sectional view along line C-C of FIG. 8A. The photolithographic and etching operations expose the substrate 10 surrounding the patterned first and second metal dichalcogenide films 15, 25.

Figure 9A:
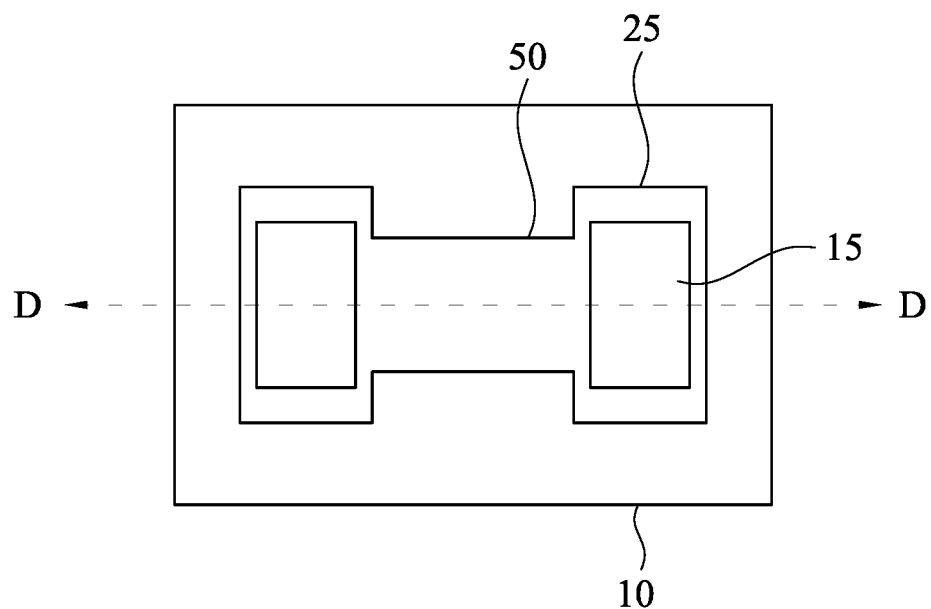
FIGS. 9A and 9B are a plan view and a cross-sectional view of a sequential stage of a method for forming a semiconductor device according to an embodiment of the disclosure.
Figure 9B:
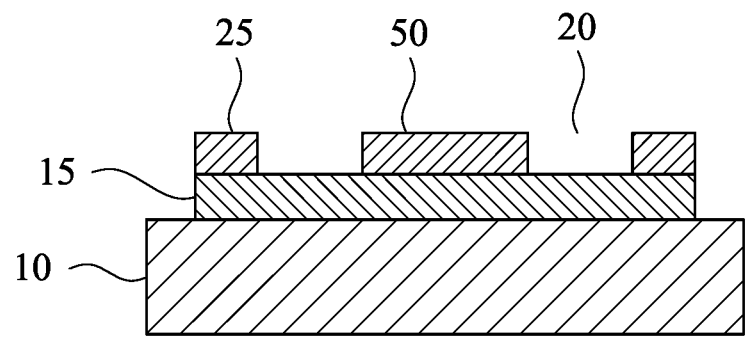

Using the oxygen plasma etching operations of the present disclosure, contact window openings 20 are formed in the second metal dichalcogenide film 15 exposing the first metal dichalcogenide film 15, as shown in FIGS. 9A and 9B. FIG. 9A is a plan view and FIG. 9B is a cross-sectional view along line D-D of FIG. 9A. In some embodiments, the oxygen plasma power ranges from about 20 W to about 60 W, and the etching time ranges from about 5 sec. to about 60 sec. In some embodiments, other plasmas are used during the plasma etch, including hydrogen, argon, or reactive ion etch (RIE) etch gases, instead of oxygen plasma.

Figure 10:
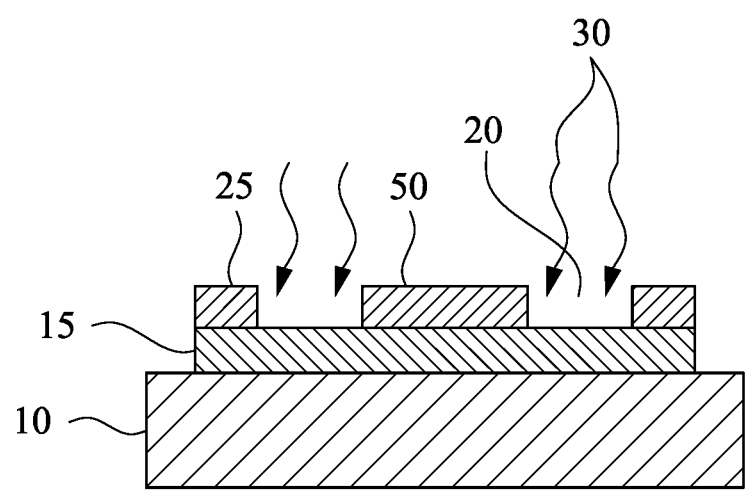
FIG. 10 is a cross-sectional view of a sequential stage of a method for forming a semiconductor device according to an embodiment of the disclosure.

After the etching operation to form the contact window openings 20, re-chalcogenization is performed as described in the present disclosure. The remaining etched portions of first and second metal dichalcogenide films 15, 25 are exposed to a chalcogen 30, such as sulfur, selenium, or tellurium vapors, to repair damage to the remaining first metal dichalcogenide film 15, and to the remaining second metal dichalcogenide film 25 if there is any damage to the second metal dichalcogenide film 25, as shown in FIG. 10. In some embodiments, the device is placed in a furnace at reduced pressure and the chalcogen vaporized by heating. The vaporized chalcogen is applied to the device using an inert carrier gas.

The re-chalcogenization operation converts substantially all the metal oxides formed by the etching operation in the first metal dichalcogenide film 15 or second metal dichalcogenide film 25 back to the first metal dichalcogenide film 15 or second metal dichalcogenide film 25, respectively. As a result of the re-chalcogenization operation of the present disclosure, there exists substantially no oxides of the first metal or the second metal on the first metal dichalcogenide film 15 or the second metal dichalcogenide film 25. Substantially no oxides of the first metal or the second metal means that the first or second metal oxide is not detected by a suitable detection means, such as by X-ray photoelectron spectroscopy (XPS).

In some embodiments, the chalcogen is sulfur and during the sulfurization procedure, Ar gas at a flow rate of from about 40 sccm to about 200 sccm is used as a carrier gas, and the furnace pressure ranges from about 0.1 Torr to about 10 Torr. The re-chalcogenization temperature for the samples is from about 400° C. to about 1200° C. About 0.5 g to about 2 g of S powder is heated in the gas flow stream to its evaporation temperature at about 120° C. to about 200° C. upstream of the furnace.

Figure 11A:
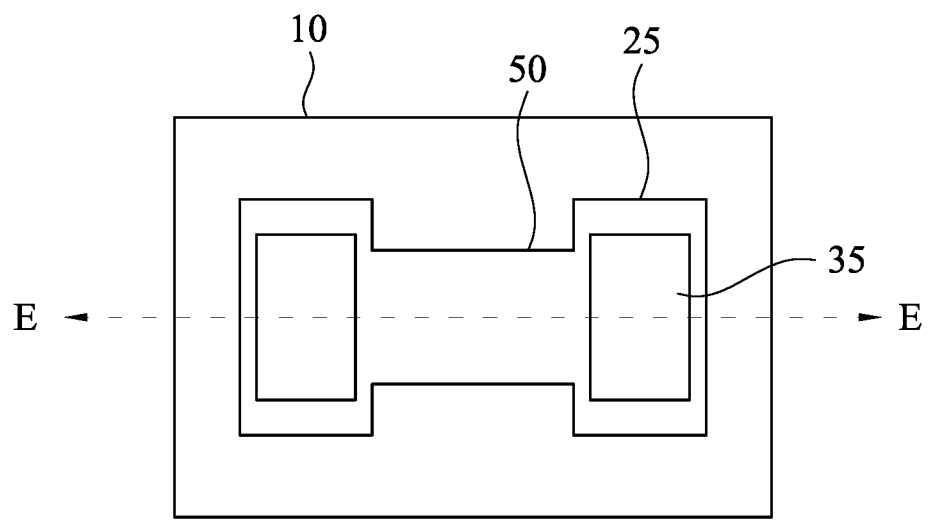
FIGS. 11A and 11B are a plan view and a cross-sectional view of a sequential stage of a method for forming a semiconductor device according to an embodiment of the disclosure.
Figure 11B:
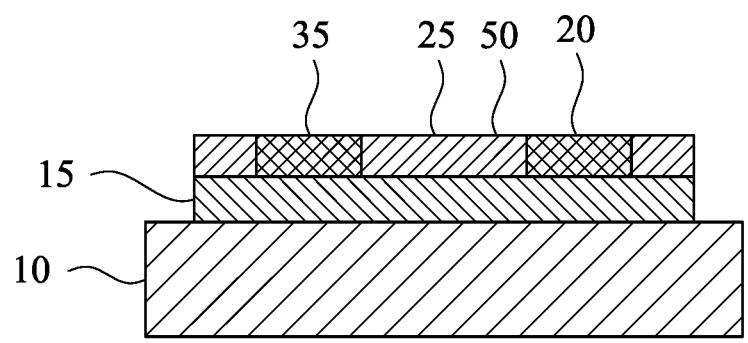

An electrically conductive layer is deposited over the exposed MoS$_2$ layers in the contact window openings 20, as shown in FIGS. 11A and 11B, to form source/drain electrodes 35. FIG. 11A is a plan view and FIG. 11B is a cross-section view along line E-E of FIG. 11A. The source/drain electrodes 35 can be formed of any suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. Graphene is used as an ohmic contact material for 2D materials in some embodiments. The source/drain electrodes 35 may be formed by chemical vapor deposition (CVD), atomic layer deposition (ALD), physical vapor deposition (PVD) (sputtering), electroplating, or other suitable method.

As shown in FIGS. 1A and 1B, a dielectric layer 40 is subsequently formed over the source/drain electrodes 35, the second metal chalcogenide film 25, the first metal chalcogenide film 15, and the substrate 10. A conductive layer 45 is then formed over the dielectric layer 40 to form a gate electrode 45, to form a top-gated hetero-structure transistor 100. Thus, a 2D hetero-structure transistor can be fabricated without using a metal dichalcogenide film transferring operation in some embodiments.

In some embodiments, the dielectric layer 40 is a silicon oxide, such as silicon dioxide. In other embodiments, the dielectric layer 40 is one or more layers of a silicon nitride or a high-k dielectric layer. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The dielectric layer 40 may be formed by chemical vapor deposition (CVD), atomic layer deposition (ALD), or any suitable method. The thickness of the dielectric layer 40 is in a range from about 1 nm to about 10 nm in some embodiments.

The gate electrode 45 can be formed of any suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrodes 45 may be formed by chemical vapor deposition (CVD), atomic layer deposition (ALD), physical vapor deposition (PVD) (sputtering), electroplating, or other suitable method.

As a result of the methods of fabricating semiconductor devices according to the present disclosure, substantially no oxides of the first metal exists at an interface between the source and drain electrodes 35 and the first metal dichalcogenide monolayer 15. Substantially no oxides of the first metal means that the first metal oxide is not detected by a suitable detection means, such as by X-ray photoelectron spectroscopy (XPS).

Figure 12:
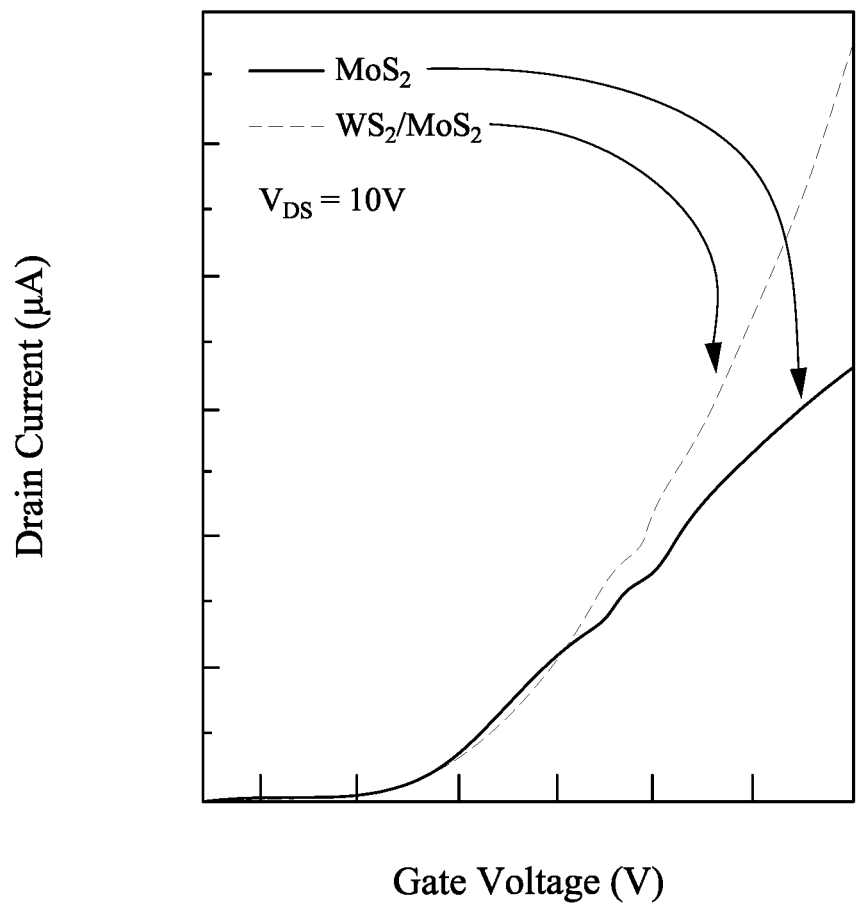
FIG. 12 shows the gate voltage versus the drain current for devices according to embodiments of the disclosure.

2D crystal hetero-structure semiconductor devices formed according to the present disclosure provide improved electrical performance. Bottom-gated transistors with either a 5-layer $MoS_2$ structure or a 4-layer $WS_2$/5-layer $MoS_2$ hetero-structure as the channels were prepared according to the methods disclosed herein. Comparison $I_D$-$V_{GS}$ curves of the 5-layer $MoS_2$ channel and 4-layer $WS_2$/5-layer $MoS_2$ hetero-structure channel transistors at $V_{DS}$=10 V are shown in FIG. 12. Compared with the $MoS_2$ transistor, a significant drain current increase is observed for the hetero-structure device. The field-effect mobility values of the two devices with $MoS_2$ and $WS_2$/$MoS_2$ hetero-structure as the channels extracted from the curves are 0.27 and 0.69 $cm^2$/V·s, respectively. Type II band alignment occurs in the $WS_2$/$MoS_2$ hetero-structure, resulting in electron injection from $WS_2$ to $MoS_2$.

In some embodiments, the layered etching includes bi-layer or tri-layer etching at the same time.

In some embodiments, the etching/re-sulfurization techniques described herein are applicable to selective etching of 2D crystal hetero-structures such as combinations of different materials such as $MoS_2$, $WS_2$, $MoSe_2$, $WSe_2$, $WTe_2$, and $MoTe_2$. In addition, the low-power oxygen plasma etching techniques described herein are used to etch graphene contacts in some embodiments.

It is understood that the semiconductor devices undergo further fabrication processes to form various features such as contacts/vias, interconnect metal layers, dielectric layers, passivation layers, etc. Additional operations performed on the semiconductor device may include photolithography, etching, chemical-mechanical polishing, thermal treatments, including rapid thermal annealing, depositions, doping, including ion-implantation, photoresist ashing, and liquid solvent cleaning.

Using the oxygen plasma etching and healing (re-sulfurization) operations of the present disclosure $WS_2$/$MoS_2$ hetero-structure transistors can be fabricated without using a film transferring operation. The present disclosure also provides a layer-by-layer etching technique of monolayer films and a method for repairing damage done to the monolayer films during etching. Thus, the present disclosure provides improved yield of 2D semiconductor devices.

It will be understood that not all advantages have been necessarily discussed herein, no particular advantage is required for all embodiments or examples, and other embodiments or examples may offer different advantages.

An embodiment of the present disclosure is a method of fabricating a semiconductor device, including plasma etching a portion of a plurality of metal dichalcogenide films comprising a compound of a metal and a chalcogen disposed on a substrate by applying a plasma to the plurality of metal dichalcogenide films. After plasma etching, a chalcogen is applied to remaining portions of the plurality of metal dichalcogenide films to repair damage to the remaining portions of the plurality of metal dichalcogenide films from the plasma etching. The chalcogen is S, Se, or Te. In an embodiment, the plasma is selected from the group consisting of oxygen, argon, hydrogen, and reactive-ion etch gases. In an embodiment, the metal dichalcogenide film includes a metal dichalcogenide selected from the group consisting of $WS_2$, $MoS_2$, $WSe_2$, $MoSe_2$, $WTe_2$, and $MoTe_2$. In an embodiment, the substrate includes silicon, silicon oxide, or aluminum oxide. In an embodiment, a plasma power ranges from about 20 W to about 60 W, and an etching time ranges from about 5 sec. to about 60 sec. In an embodiment, the applying a chalcogen to remaining portions of the plurality of metal dichalcogenide films is a re-sulfurization operation in which evaporated sulfur is applied to the remaining portions of the plurality of metal dichalcogenide films. In an embodiment, the metal dichalcogenide films have a thickness of about 0.5 nm to about 10 nm. In an embodiment, before the plasma etching, a first metal dichalcogenide film including a first metal dichalcogenide is formed on the substrate; and a second metal dichalcogenide film including a second metal dichalcogenide is formed on the first metal dichalcogenide film to form the plurality of metal dichalcogenide films, wherein the first metal dichalcogenide and the second metal dichalcogenide are different in composition. In an embodiment, the plasma etching removes a portion of the second metal dichalcogenide film, thereby exposing a portion of the first metal dichalcogenide film. In an embodiment, the plasma is an oxygen plasma, the chalcogen is sulfur, and the applying an additional quantity of the chalcogen to the remaining portions of the plurality of metal dichalcogenide layers converts metal oxides formed during the plasma etching to metal sulfides.

Another embodiment of the present disclosure is a method of fabricating a semiconductor device, including forming a first metal dichalcogenide film including a compound of a first metal and a first chalcogen on a substrate and forming a second metal dichalcogenide film including a compound of a second metal and a second chalcogen on the first metal dichalcogenide film. The first metal dichalcogenide film and second metal dichalcogenide film are patterned to form a channel region including the first and second metal dichalcogenide films. Spaced-apart portions of the channel region are selectively etched to remove portions of the second metal dichalcogenide film, thereby exposing portions of the first metal dichalcogenide film. An additional quantity of the first chalcogen is applied to at least the exposed portions of the first metal dichalcogenide film. A first conductive layer is deposited on the exposed portions of the first metal dichalcogenide film. A dielectric layer is deposited over the second metal dichalcogenide film and the first conductive layer, and a second conductive layer is formed over the dielectric layer. The first and second chalcogens are S, Se, or Te. In an embodiment, the etching is plasma etching using a plasma, and the plasma is selected from the group consisting of oxygen, argon, hydrogen, and reactive-ion etch gases. In an embodiment, a plasma power ranges from about 20 W to about 60 W, and an etching time ranges from about 5 sec. to about 60 sec. In an embodiment, the plasma is an oxygen plasma, the chalcogen is sulfur, and the applying an additional quantity of the first chalcogen to at least the first metal dichalcogenide film converts metal oxides formed during the plasma etching to metal sulfides. In an embodiment, the first and second metal dichalcogenides are selected from the group consisting of $WS_2$, $MoS_2$, $WSe_2$, $MoSe_2$, $WTe_2$, and $MoTe_2$. In an embodiment, the substrate includes silicon, silicon oxide, or aluminum oxide. In an embodiment, the applying an additional quantity of the first chalcogen to at least the first metal dichalcogenide film is a re-chalcogenization operation in which evaporated chalcogen is applied to the first metal dichalcogenide film. In an embodiment, the first and second metal dichalcogenide layers have a thickness of about 0.5 nm to about 10 nm.

Another embodiment of the present disclosure is a semiconductor device, including a first metal dichalcogenide monolayer including a compound of a first metal and a first chalcogen disposed on a substrate and a second metal dichalcogenide monolayer including a second metal and a second chalcogen disposed on the first metal dichalcogenide monolayer. Source and drain electrodes are disposed on the first metal dichalcogenide monolayer on opposing sides of the second metal dichalcogenide monolayer. A dielectric layer is disposed on the second metal dichalcogenide monolayer and the source and drain electrodes. A gate electrode is disposed on the dielectric layer aligned with the second metal dichalcogenide monolayer. The first metal dichalcogenide monolayer and the second metal dichalcogenide monolayer include different metal dichalcogenides. The first and second chalcogens are S, Se, or Te. Substantially no oxides of the first metal exist at an interface between the source and drain electrodes and the first metal dichalcogenide monolayer. In an embodiment, the substrate includes sapphire, the first metal dichalcogenide includes $MoS_2$, $MoSe_2$, or $MoTe_2$, and the second metal dichalcogenide includes $WS_2$, $WSe_2$, or $WTe_2$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    plasma etching a portion of a plurality of metal dichalcogenide films comprising a compound of a metal and a chalcogen disposed on a substrate by applying a plasma to the plurality of metal dichalcogenide films, wherein a top metal dichalcogenide film of the plurality of metal dichalcogenide films is formed by:
        depositing a metal film by physical vapor deposition on top of another metal dichalcogenide film; and
        reacting the metal film with a chalcogen;
    after plasma etching, applying an additional quantity of the chalcogen to remaining portions of the plurality of metal dichalcogenide films to repair damage to the remaining portions of the plurality of metal dichalcogenide films caused by the plasma etching; and
    wherein after the repair, substantially no metal oxide is on the remaining portions of the plurality of metal dichalcogenide films.

2. The method of claim 1, wherein the plasma is selected from the group consisting of oxygen, argon, hydrogen, and reactive-ion etch gases.

3. The method of claim 1, wherein each one of the plurality of metal dichalcogenide films comprise a metal dichalcogenide selected from the group consisting of $WS_2$, $MoS_2$, $WSe_2$, $MoSe_2$, $WTe_2$, and $MoTe_2$.

4. The method of claim 1, wherein the applying the additional quantity of the chalcogen to remaining portions of the plurality of metal dichalcogenide films is a re-sulfurization operation in which evaporated sulfur is applied to the remaining portions of the plurality of metal dichalcogenide films.

5. The method of claim 1, further comprising before the plasma etching:
    forming a first metal dichalcogenide film comprising a first metal dichalcogenide on the substrate; and
    forming a second metal dichalcogenide film comprising a second metal dichalcogenide on the first metal dichalcogenide film to form the plurality of metal dichalcogenide films,
    wherein the first metal dichalcogenide and the second metal dichalcogenide are different in composition.

6. The method of claim 5, wherein the plasma etching removes a portion of the second metal dichalcogenide film, thereby exposing a portion of the first metal dichalcogenide film.

7. The method according of to claim 1, wherein the plasma is an oxygen plasma, the chalcogen is sulfur, and the applying an additional quantity of the chalcogen to the remaining portions of the plurality of metal dichalcogenide films converts metal oxides formed during the plasma etching to metal sulfides.

8. A method of fabricating a semiconductor device, comprising:
    forming a first metal dichalcogenide film comprising a compound of a first metal and a first chalcogen on a substrate;
    forming a second metal dichalcogenide film comprising a compound of a second metal and a second chalcogen on the first metal dichalcogenide film;

patterning the first metal dichalcogenide film and second metal dichalcogenide film to form a channel region comprising the first and second metal dichalcogenide films;

selectively etching spaced-apart portions of the channel region to remove portions of the second metal dichalcogenide film, thereby exposing portions of the first metal dichalcogenide film;

applying an additional quantity of the first chalcogen to at least exposed portions of the first metal dichalcogenide film;

performing X-ray photoelectron spectroscopy to the exposed portions of the first metal dichalcogenide film to confirm that substantially no metal oxide is on the exposed portions of the first metal dichalcogenide film;

depositing a first conductive layer on the exposed portions of the first metal dichalcogenide film;

depositing a dielectric layer over the second metal dichalcogenide film and the first conductive layer; and forming a second conductive layer over the dielectric layer.

9. The method of claim 8, wherein the etching is plasma etching using a plasma and the plasma is selected from the group consisting of oxygen, argon, hydrogen, and reactive-ion etch gases.

10. The method of claim 9, wherein a plasma power ranges from about 20 W to about 60 W, and an etching time ranges from about 5 sec. to about 60 sec.

11. The method of claim 9, wherein the plasma is an oxygen plasma, the first chalcogen is sulfur, and the applying an additional quantity of the first chalcogen to at least the first metal dichalcogenide film converts metal oxides formed during the plasma etching to metal sulfides.

12. The method of claim 8, wherein the first and second metal dichalcogenides are different in composition and are selected from the group consisting of $WS_2$, $MoS_2$, $WSe_2$, $MoSe_2$, $WTe_2$, and $MoTe_2$.

13. The method of claim 8, wherein the substrate comprises silicon, silicon oxide, or aluminum oxide.

14. The method of claim 8, wherein the applying an additional quantity of the first chalcogen to at least exposed portions of the first metal dichalcogenide film is a re-chalcogenization operation in which evaporated chalcogen is applied to the first metal dichalcogenide film.

15. The method of claim 8, wherein the first and second metal dichalcogenide films have a thickness of about 0.5 nm to about 10 nm.

16. A method of fabricating a semiconductor device, comprising:

forming a first metal dichalcogenide monolayer film comprising a compound of a first metal and a first chalcogen on a substrate by:
  depositing a first metal film of the first metal by atomic layer deposition; and
  reacting the first metal film with a first chalcogen;

forming a second metal dichalcogenide monolayer film comprising a compound of a second metal and a second chalcogen on the first metal dichalcogenide monolayer film by:
  depositing a second metal film of the second metal by atomic layer deposition; and
  reacting the second metal film with a second chalcogen;

etching the second metal dichalcogenide monolayer film by oxygen plasma to form at least one opening exposing a portion of the first metal dichalcogenide monolayer film;

applying a vaporized chalcogen to at least the exposed portion of the first metal dichalcogenide monolayer film; and wherein after the applying the vaporized chalcogen, substantially no metal oxide is on the exposed portion of the first metal dichalcogenide monolayer film.

17. The method of claim 16, wherein:
the applying the vaporized chalcogen comprises applying evaporated sulfur.

18. The method of claim 16, wherein:
the substrate comprises sapphire,
the first metal dichalcogenide monolayer film comprises $MoS_2$, $MoSe_2$, or $MoTe_2$, and
the second metal dichalcogenide monolayer film comprises $WS_2$, $WSe_2$, or $WTe_2$.

19. The method of claim 16, wherein the first and second metal dichalcogenide monolayer films have a thickness of about 0.5 nm to about 10 nm.

20. The method of claim 16, wherein a plasma power ranges from about 20 W to about 60 W, and an etching time ranges from about 5 sec. to about 60 sec.

* * * * *